United States Patent
Hwang et al.

(10) Patent No.: US 12,439,738 B2
(45) Date of Patent: Oct. 7, 2025

(54) SEMICONDUCTOR STRUCTURE AND METHOD OF MANUFACTURING THE SAME

(71) Applicants: SAMSUNG ELECTRONICS CO., LTD., Suwon-si (KR); SEOUL NATIONAL UNIVERSITY R&DB FOUNDATION, Seoul (KR)

(72) Inventors: Kyungwook Hwang, Seoul (KR); Ho Won Jang, Seoul (KR); Junsik Hwang, Hwaseong-si (KR); Jehong Oh, Seoul (KR); Jungel Ryu, Seoul (KR); Seungmin Lee, Seoul (KR)

(73) Assignees: SAMSUNG ELECTRONICS CO., LTD., Suwon-si (KR); SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 626 days.

(21) Appl. No.: 17/527,366

(22) Filed: Nov. 16, 2021

(65) Prior Publication Data
US 2022/0216368 A1   Jul. 7, 2022

(30) Foreign Application Priority Data

Jan. 4, 2021   (KR) .................. 10-2021-0000544
Mar. 4, 2021   (KR) .................. 10-2021-0029053

(51) Int. Cl.
*H01L 33/12* (2010.01)
*C30B 25/04* (2006.01)
(Continued)

(52) U.S. Cl.
CPC .......... *H10H 20/815* (2025.01); *C30B 25/04* (2013.01); *C30B 25/186* (2013.01);
(Continued)

(58) Field of Classification Search
CPC ............ H10H 20/815; H10H 20/0137; H10H 20/825; H10H 20/819; H10H 20/018;
(Continued)

(56) References Cited

U.S. PATENT DOCUMENTS 5,461,003 A * 10/1995 Havemann ........ H01L 21/02126
                                                    438/666
6,610,593 B2 * 8/2003 Kohl .................... H01L 21/7682
                                                    438/778
(Continued)

FOREIGN PATENT DOCUMENTS

JP   3528814 B2   5/2004
JP   5519347 B2   6/2014
(Continued)

OTHER PUBLICATIONS

Chapter 4 titled "Applications of Ultra-Precision CMP in Device Processing" in Advances in CMP/Polishing Technologies (2012).*
(Continued)

*Primary Examiner* — Jay C Kim
(74) *Attorney, Agent, or Firm* — Sughrue Mion, PLLC

(57) ABSTRACT

Provided are a semiconductor structure and a method of manufacturing the same. The semiconductor structure includes a substrate, a membrane bridge that defines, with the substrate, a plurality of cavities, and a nitride semiconductor layer arranged on the membrane bridge. The membrane bridge and the substrate have the same crystal structure. The membrane bridge has an upper surface with a constant height with respect to a surface of the substrate.

13 Claims, 10 Drawing Sheets

(51) Int. Cl.
    *C30B 25/18*     (2006.01)
    *C30B 29/40*     (2006.01)
    *H10H 20/01*     (2025.01)
    *H10H 20/815*     (2025.01)
    *H10H 20/825*     (2025.01)

(52) U.S. Cl.
    CPC ....... *C30B 29/403* (2013.01); *H10H 20/0137* (2025.01); *H10H 20/825* (2025.01)

(58) Field of Classification Search
    CPC ............. H10H 20/01335; C30B 25/04; C30B 25/186; C30B 29/403; H01L 33/12; H01L 33/0075; H01L 33/32
    See application file for complete search history.

(56) References Cited

U.S. PATENT DOCUMENTS

| | | | |
|---|---|---|---|
| 6,946,382 B2* | 9/2005 | Townsend, III | H01L 21/02216 257/E21.259 |
| 7,052,821 B2* | 5/2006 | Kohl | B81C 1/00476 430/273.1 |
| 7,459,267 B2* | 12/2008 | Kohl | B81C 1/00476 430/330 |
| 8,603,886 B2* | 12/2013 | Wuu | H01L 21/02002 257/E29.089 |
| 9,000,464 B2* | 4/2015 | Chang | H01L 29/06 257/E29.022 |
| 9,209,349 B2* | 12/2015 | Lee | H01L 33/0075 |
| 9,793,359 B2* | 10/2017 | Yoon | H01L 21/02658 |
| 10,205,052 B2 | 2/2019 | Yoon et al. | |
| 10,355,169 B2 | 7/2019 | Bae et al. | |
| 11,621,367 B2* | 4/2023 | Hwang | H01L 33/405 257/89 |
| 11,624,090 B2* | 4/2023 | Suryanaraya | C12Q 1/6869 435/6.1 |
| 11,699,587 B2* | 7/2023 | Nam | H01L 21/02491 438/105 |
| 12,237,439 B2* | 2/2025 | Yoon | H10H 20/821 |
| 2012/0217537 A1* | 8/2012 | Jin | H01L 21/0254 438/46 |
| 2020/0035890 A1* | 1/2020 | Yoon | H01L 25/0753 |
| 2021/0159361 A1* | 5/2021 | Hwang | H01L 33/38 |

FOREIGN PATENT DOCUMENTS

| | | |
|---|---|---|
| KR | 10-2016-0008339 A | 1/2016 |
| KR | 10 1590475 B1 | 2/2016 |

OTHER PUBLICATIONS

Communication dated Aug. 18, 2025 issued by the Korean Intellectual Property Office in Korean Patent Application No. 10-2021-0029053.

* cited by examiner

SEMICONDUCTOR STRUCTURE AND METHOD OF MANUFACTURING THE SAME

CROSS-REFERENCE TO RELATED APPLICATIONS

This application is based on and claims priority under 35 U.S.C. § 119 to Korean Patent Application No. 10-2021-0000544, filed on Jan. 4, 2021, in the Korean Intellectual Property Office, and Korean Patent Application No. 10-2021-0029053, filed on Mar. 4, 2021, in the Korean Intellectual Property Office, the disclosures of which are incorporated by reference herein in their entireties.

BACKGROUND

1. Field

Disclosed example embodiments relate to a semiconductor structure and a method of manufacturing the same.

2. Description of Related Art

Nitride semiconductors have been applied to electronic and optoelectronic devices. Nitride semiconductors are applicable to a wide range of devices, from laser diodes (LDs) to transistors capable of operating at high frequencies and high temperatures. They are also applicable to ultraviolet light detectors, surface acoustic wave devices, and light-emitting diodes (LEDs).

A sapphire substrate is frequently used as a substrate for forming a nitride-based semiconductor device. However, sapphire substrates are expensive and hard, and thus a chip having a sapphire substrate is difficult to manufacture, and has low electrical conductivity. In addition, when a sapphire substrate is epitaxially grown with a large diameter, warpage may occur in the substrate itself at a high temperature due to its low thermal conductivity, and thus it is difficult to manufacture the sapphire substrate in a large area.

In order to overcome this limitation, a nitride-based semiconductor device using a silicon substrate instead of a sapphire substrate has been developed. Because silicon substrates have higher thermal conductivity than the sapphire substrates, the degree of warpage in the silicon substrates is not large even at the growth temperature of a nitride thin film that is grown at a high temperature, and accordingly, a large-diameter thin film may be grown. However, when a nitride semiconductor layer is grown on a silicon substrate, the dislocation density increases due to the mismatch in lattice constants between the substrate and a thin film, and cracks occur due to the mismatch in thermal expansion coefficients. Therefore, a method of reducing a defect density and a method of preventing cracks are being studied.

In addition, a nitride semiconductor layer (e.g., a micro-LED) having a small size may be manufactured by growing a large-area nitride semiconductor layer and then performing, generally, an etching process. For example, a mask having a preset size may be manufactured, and the nitride semiconductor layer may be etched in a micro unit through a semiconductor process. However, when the nitride semiconductor layer is etched, a leakage current in a lateral surface of the nitride semiconductor layer may be caused due to etching damage. This may cause the properties of the nitride semiconductor layer to deteriorate.

SUMMARY

Provided are a method of growing a nitride semiconductor layer in a device unit, and a structure of the nitride semiconductor layer.

Provided are a method of growing a nitride semiconductor layer while reducing a defect density, and a structure of the nitride semiconductor layer.

Additional aspects will be set forth in part in the description which follows and, in part, will be apparent from the description, or may be learned by practice of the presented example embodiments of the disclosure.

In accordance with an aspect of the disclosure, a method of manufacturing a semiconductor structure includes forming, on a substrate, a sacrificial layer pattern including a plurality of sacrificial layers spaced apart from each other; forming, on the sacrificial layer pattern, a membrane bridge that covers the plurality of sacrificial layers and including an upper surface with a constant height with respect to a surface of the substrate; removing the sacrificial layer pattern from the substrate to form a plurality of cavities defined by the substrate and the membrane bridge; crystallizing the membrane bridge such that the membrane bridge and the substrate have a same crystal structure; and growing a nitride semiconductor layer on the crystallized membrane bridge.

A gap between adjacent sacrificial layers of the plurality of sacrificial layers may be less than a width of each of the plurality of sacrificial layers.

A gap between adjacent sacrificial layers of the plurality of sacrificial layers may be less than or equal to half of a width of each of the plurality of sacrificial layers.

A gap between adjacent sacrificial layers of the plurality of sacrificial layers may be about 500 nm or less.

The plurality of cavities may be in contact with the substrate.

The membrane bridge may include a plurality of first regions wherein each of the plurality of first regions overlaps a respective sacrificial layer of the plurality of sacrificial layers in a thickness direction of the substrate; and a plurality of second regions that do not overlap any of the plurality of sacrificial layers in the thickness direction of the substrate.

Each of the plurality of second regions may fill a respective space between adjacent sacrificial layers of the plurality of sacrificial layers.

A width of each of the plurality of second regions may be less than a thickness of the plurality of first regions.

A width of the plurality of first regions may be about 1 μm or less.

Each of the plurality of second regions may include a first sub-region and a second sub-region, wherein a first end of the first sub-region is spaced apart from a first end of the second sub-region, wherein the first end of the first sub-region and the first end of the second sub-region are in contact with the substrate, and wherein a second end of the first sub-region is in contact with a second end of the second sub-region.

For each second region of the plurality of second regions, a second cavity may be formed between the first sub-region and the second sub-region.

For each first region of the plurality of first regions, a width of a corresponding cavity of the plurality of cavities may decrease from the first region toward the substrate.

A size of each of the plurality of second cavities may be less than a size of each of the plurality of cavities.

The membrane bridge may include at least one of silica (SiO2), alumina (Al2O3), titania (TiO2), zirconia (ZrO2), yttria (Y2O3)-zirconia, copper oxide (CuO, Cu2O), tantalum oxide (Ta2O5), aluminum nitride (AlN), and silicon nitride (Si3N4).

In accordance with an aspect of the disclosure, a semiconductor structure includes a substrate; a membrane bridge that defines, with the substrate, a plurality of cavities, wherein the membrane bridge and the substrate have a same crystal structure and the membrane bridge includes an upper surface with a constant height with respect to a surface of the substrate; and a nitride semiconductor layer arranged on the membrane bridge.

The membrane bridge may include a plurality of first regions wherein each of the plurality of first regions overlaps a respective cavity of the plurality of cavities in a thickness direction of the substrate; and a plurality of second regions that do not overlap any of the plurality of cavities in the thickness direction of the substrate.

A width of each of the plurality of first regions may be greater than a width of each of the plurality of second regions.

A width of each of the plurality of second regions may be less than a thickness of each of the plurality of first regions.

Each of the plurality of second regions may include a first sub-region and a second sub-region, wherein a first end of the first sub-region is spaced apart from a first end of the second sub-region, wherein the first end of the first sub-region and the first end of the second sub-region are in contact with the substrate, and wherein a second end of the first sub-region is in contact with a second end of the second sub-region.

For each second region of the plurality of second regions, a second cavity may be arranged between the first sub-region and the second sub-region.

BRIEF DESCRIPTION OF THE DRAWINGS

The above and other aspects, features, and advantages of certain example embodiments of the disclosure will be more apparent from the following description taken in conjunction with the accompanying drawings, in which.

DETAILED DESCRIPTION

Figure 1:
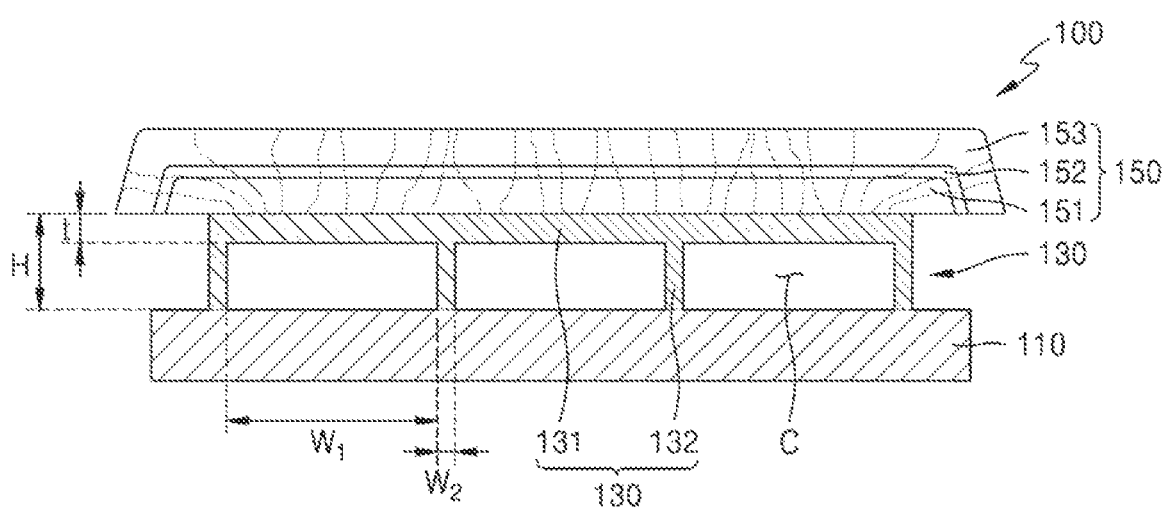
FIG. 1 is a diagram illustrating a structure including a nitride semiconductor according to an embodiment.

Reference will now be made in detail to embodiments, examples of which are illustrated in the accompanying drawings, wherein like reference numerals refer to like elements throughout. In this regard, embodiments may have different forms and should not be construed as being limited to the descriptions set forth herein. Accordingly, embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments will be described in detail with reference to the accompanying drawings. The described embodiments are merely examples, and various modifications are possible from these embodiments. In the following drawings, like reference numerals refer to like elements, and sizes of elements in the drawings may be exaggerated for clarity and convenience of description.

An expression "above" or "on" used herein may include not only "immediately on in a contact manner" but also "on in a non-contact manner".

Terms such as "first" or "second" may be used to describe various elements, but the elements should not be limited by the terms. The terms do not define that the elements have different materials or structures from each other.

An expression used in the singular encompasses the expression of the plural, unless it has a clearly different meaning in the context. In addition, when an element "includes" or "comprises" an element, unless there is a particular description contrary thereto, the element can further include other elements, not excluding the other elements.

The term "the" and other demonstratives similar thereto should be understood to include a singular form and plural forms.

The operations of a method can be performed in any suitable order unless otherwise indicated herein or otherwise clearly contradicted by context. In addition, all example terms (e.g., "such as" or "etc.") are used for the purpose of description and are not intended to limit the scope of the present disclosure unless defined by the claims.

FIG. 1 is a diagram illustrating a structure 100 including a nitride semiconductor according to an embodiment. As illustrated in FIG. 1, the structure 100 including a nitride semiconductor may include a substrate 110, a membrane bridge 130 that defines, with the substrate 110, a plurality of cavities C, and a nitride semiconductor layer 150 on the membrane bridge 130.

The substrate 110 may be a monocrystalline substrate of a heterogeneous material used to grow a heterogeneous epitaxial layer of the nitride semiconductor layer 150, such as a sapphire substrate, a silicon substrate, a SiC substrate, or a GaAs substrate The membrane bridge 130 and the substrate 110 may define the plurality of cavities C to be separate from each other. That is, a part of each cavity C may be defined by the substrate 110, and the remaining part of each cavity C may be defined by the membrane bridge 130.

The membrane bridge 130 may include first regions 131 having lower surfaces defining the cavities C, respectively, and second regions 132 having lower surfaces in contact with the substrate 110. Upper surfaces of the first regions 131 and the second regions 132 may have a preset height H with respect to a surface of the substrate 110 as shown, e.g., in FIG. 1. Accordingly, an upper surface of the membrane bridge 130 may have the same height H across its entirety.

A thickness t of the first region 131 may be less than a thickness of the substrate 110 and may be less than a thickness of the nitride semiconductor layer 150 that will be described below. A width w1 of the first region 131 may be greater than or equal to a width w2 (hereinafter, also referred to as the gap w2) of the second region 132. For example, the thickness t of the first region 131 may be about 500 nm or less, and the width w1 of the first region 131 may be 1 μm or less. In addition, the width w2 of the second region 132 may be 500 nm or less.

The membrane bridge 130 may include at least one of oxide or nitride, such as silica (SiO2), alumina (Al2O3), titania (TiO2), zirconia (ZrO2), yttria (Y2O3)-zirconia, copper oxide (CuO, Cu2O), tantalum oxide (Ta2O5), aluminum nitride (AlN), or silicon nitride (Si3N4). By adjusting at least one of the composition, strength, and thickness t of the membrane bridge 130, it is possible to regulate stress applied to the nitride semiconductor layer 150 subsequently formed on a structure using the membrane bridge 130.

The nitride semiconductor layer 150 may be arranged on the upper surface of the membrane bridge 130. For example, the nitride semiconductor layer 150 may include a first semiconductor layer 151, an active layer 152, and a second semiconductor layer 153.

The first semiconductor layer 151 may include, for example, an n-type semiconductor. However, the disclosure is not limited thereto, and in some cases, the first semiconductor layer 151 may include a p-type semiconductor. The first semiconductor layer 151 may include a III-V group n-type semiconductor, for example, n-GaN. The first semiconductor layer 151 may have a single-layer or multi-layer structure. For example, the first semiconductor layer 151 may include any one semiconductor material of InAlGaN, GaN, AlGaN, InGaN, AlN, or InN, and may include a semiconductor layer doped with a conductive dopant such as Si, Ge, or Sn.

The active layer 152 may be arranged on an upper surface of the first semiconductor layer 151. The active layer 152 may generate light as electrons combine with holes, and may have a multi-quantum well (MQW) structure or a single-quantum well (SQW) structure. The active layer 152 may include a III-V group semiconductor, for example, InGaN, GaN, AlGaN, or AlInGaN.

The second semiconductor layer 153 may be provided on the active layer 152, and may include a semiconductor layer of a different type from the first semiconductor layer 151. For example, the second semiconductor layer 153 may include a p-type semiconductor layer. The second semiconductor layer 153 may include, for example, InAlGaN, GaN, AlGaN, and/or InGaN, and may be a semiconductor layer doped with a conductive dopant such as Mg.

In addition to the first semiconductor layer 151, the active layer 152, and the second semiconductor layer 153, the nitride semiconductor layer 150 may further include a clad layer and/or a buffer layer on and/or under each layer.

The nitride semiconductor layer 150 may be grown directly on the membrane bridge 130.

FIG. 2A to FIG. 2E are diagrams illustrating a method of manufacturing the semiconductor structure 100, according to an embodiment.

Figure 2A:
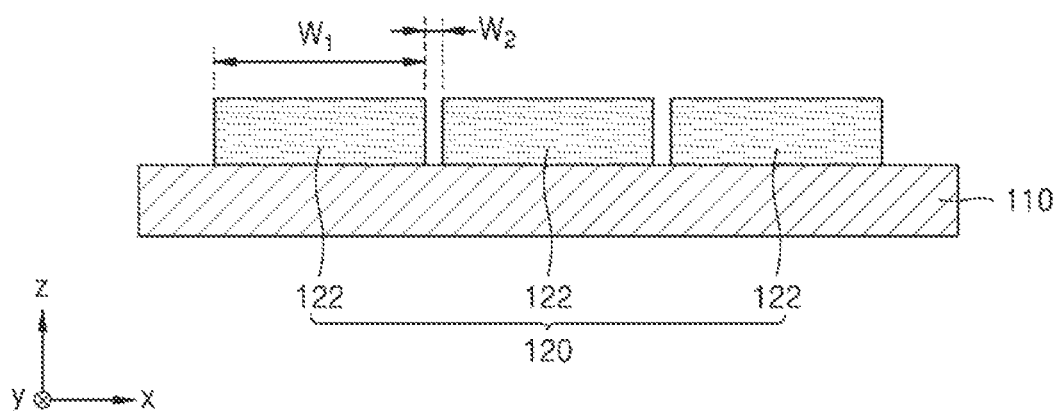
FIG. 2A to FIG. 2E are diagrams illustrating a method of manufacturing a semiconductor structure, according to an embodiment.

Referring to FIG. 2A, a sacrificial layer pattern 120 may be formed on the substrate 110. The sacrificial layer pattern 120 may include a plurality of sacrificial layers 122 spaced apart from each other. A thickness and a width of the sacrificial layer pattern 120 may be determined considering the cavities C to be finally formed. The gap w2 between the sacrificial layers 122 may be less than the width w1 of the sacrificial layer 122. For example, the gap w2 between the sacrificial layers 122 may be less than or equal to half of the width w1 of the sacrificial layer 122, or may be 1 μm or less. Because the gap w2 between the sacrificial layers 122 is narrow, the material of the membrane bridge 130 may fill the gap w2 between the sacrificial layers 122 when the membrane bridge 130 is formed in a subsequent process.

The sacrificial layer pattern 120 may be uniformly formed entirely on the substrate 110 in the same pattern. The sacrificial layer pattern 120 may be of a line-and-space type, and may have a shape extending in the y-axis direction or the x-axis direction on the substrate 110. However, the sacrificial layer pattern 120 is not limited thereto. The sacrificial layer pattern 120 may be formed on the substrate 110 in a locally different pattern.

The sacrificial layer pattern 120 may be formed by various methods such as photolithography, nanoimprinting, or organic nanoparticle attachment. As described above, the method of forming the sacrificial layer pattern 120 according to an embodiment is relatively simple, and the degree of damage to the substrate 110 is relatively low and the process may be simplified compared to the case of etching the substrate 110 by conventional technology such as a patterned sapphire substrate (PSS).

Any monocrystalline substrate of a heterogeneous material used to grow a heterogeneous epitaxial layer of the nitride semiconductor layer 150, such as a sapphire, silicon, SiC, or GaAs substrate, may be used for the substrate 110 on which the sacrificial layer pattern 120 is formed.

Figure 2B:
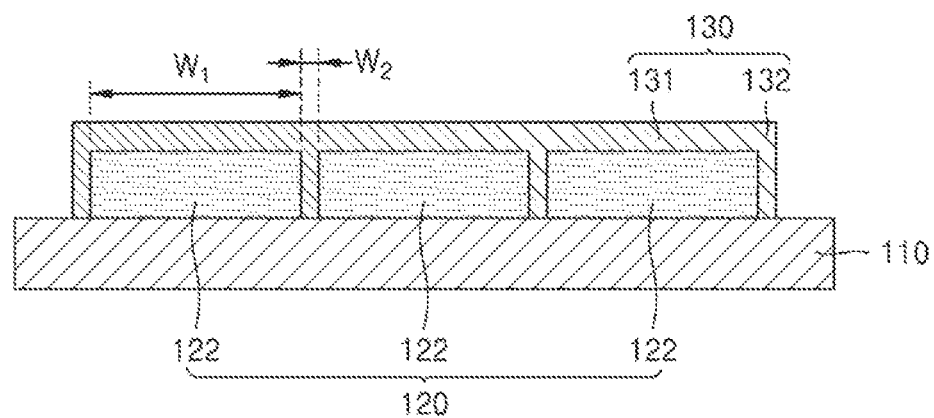

Referring to FIG. 2B, the membrane bridge 130 that covers the sacrificial layer pattern 120 may be formed on the sacrificial layer pattern 120. The membrane bridge 130 may be formed by various methods such as atomic layer deposition (ALD), wet synthesis, metal deposition and oxidation, or sputtering. The membrane bridge 130 may be a seed for growing the nitride semiconductor layer 150.

The thickness t of the membrane bridge 130 (see, e.g., FIG. 1) may be about 20 nm to about 100 nm, and the thickness t thereof may be an important factor that defines crystallographic properties because of a correlation with a thickness of a semiconductor layer to be grown in a subsequent process.

The membrane bridge 130 subsequently defines the cavities C with the substrate 110, and may be formed within a range of temperatures at which the sacrificial layer pattern 120 is not deformed. The thickness t of the membrane bridge 130 may be determined such that the structure thereof stably maintains its original shape after the sacrificial layer pattern 120 is removed. In order for the cavities C to be structurally stable on the substrate 110, it is advantageous that a part of the membrane bridge 130 is in direct contact with the substrate 110 when the membrane bridge 130 is formed.

The membrane bridge 130 may include the first regions 131 that overlap the sacrificial layers 122, respectively, in the thickness direction of the substrate 110 and the second regions 132 that do not overlap the sacrificial layers 122 in the thickness direction of the substrate 110. As the upper surfaces of the first regions 131 and the upper surfaces of the second regions 132 have the same height H with respect to a surface of the substrate 110, the nitride semiconductor layer 150 that is to be grown on the membrane bridge 130 may have similar defect densities on the first and second regions 131 and 132.

The second regions 132 may be in direct contact with the substrate 110 such that the membrane bridge 130 maintains its shape even after the sacrificial layers 122 are removed. The width w2 of the second region 132 may be less than or equal to the width w1 of the first region 131, and may be less than or equal to the thickness t of the first region 131. As it may be difficult to separate the nitride semiconductor layer 150 from the substrate 110 in the case where the width w2 of the second region 132 is large, the width w2 of the second region 132 may be 500 nm or less.

The membrane bridge 130 may be an amorphous material. For example, the membrane bridge 130 may include at least one of oxide or nitride, such as amorphous silica ($SiO_2$), alumina ($Al_2O_3$), titania ($TiO_2$), zirconia ($ZrO_2$), yttria ($Y_2O_3$)-zirconia, copper oxide (CuO, $Cu_2O$), tantalum oxide ($Ta_2O_5$), aluminum nitride (AlN), or silicon nitride ($Si_3N_4$). It is preferable to form an alumina membrane bridge on a sapphire substrate. By adjusting at least one of the composition, strength, and thickness t of the membrane bridge 130, it is possible to regulate stress applied to the nitride semiconductor layer 150 subsequently formed on a structure using the membrane bridge 130. As illustrated in FIG. 2B, the membrane bridge 130 may be formed on the entire surface of the substrate 110 while covering the sacrificial layer pattern 120.

Alumina may be applied with a uniform thickness t on the substrate 110 and the sacrificial layer pattern 120 by a deposition method such as ALD. Wet synthesis using a wet solution may be used instead of the deposition method. The wet solution may be uniformly coated on the substrate 110 and the sacrificial layer pattern 120, and then alumina may be synthesized by heating, drying, or a chemical reaction. For example, an alumina thin film may be coated on the substrate 110 by mixing an aluminum precursor powder such as aluminum chloride ($AlCl_3$) with a solvent such as tetrachloroethylene ($C_2Cl_4$), applying and coating the mixture on the substrate 110 on which the sacrificial layer pattern 120 is formed, and heating the mixture under an oxygen atmosphere to cause a reaction. Alternatively, alumina may be formed by depositing a metal Al thin film by a method such as sputtering, and then performing an oxidation process. The alumina may be formed in an amorphous state or in a polycrystalline state of fine grains.

Figure 2C:
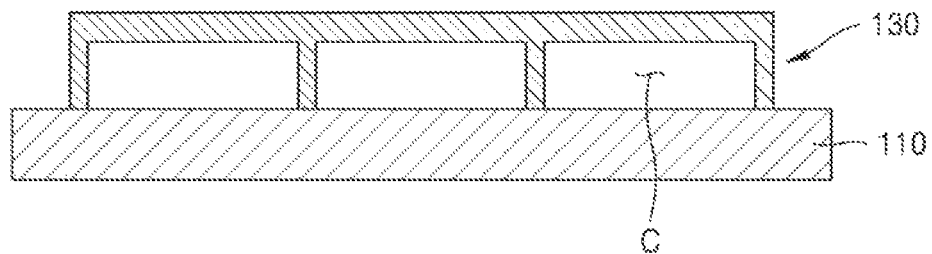

As illustrated in FIG. 2C, the sacrificial layer pattern 120 may be removed from the substrate 110. Because the sacrificial layer pattern 120 is a polymer such as a photosensitive film, a resin for nanoimprinting, or organic nanoparticles, it may be easily removed by a heating method. The photosensitive film having an autoignition temperature of about 600° C. may be easily removed by heat. Furthermore, for easier removal by burning in an oxidation manner, a chemical reaction with gas including oxygen may be added. When it is heated at high temperature under an oxygen atmosphere, polymer components may be easily removed by a thermal decomposition process, commonly called ashing. For example, the sacrificial layer pattern 120 may be removed by heat treatment under an oxygen atmosphere. In the case where the heat treatment under an oxygen atmosphere is improper, for example, in the case where the substrate 110 is a silicon substrate, and there is a concern about oxide generation, wet removal using an organic solvent may be used. After the sacrificial layer pattern 120 is removed, the cavities C defined by the substrate 110 and the membrane bridge 130 may be formed as illustrated in FIG. 2C. Although the plurality of cavities C are formed in an example embodiment separated from each other, the shape of the cavities may vary depending on the shape of the previously formed sacrificial layer pattern 120. The cavities C may have an inverse shape of the sacrificial layer pattern 120.

Figure 2D:
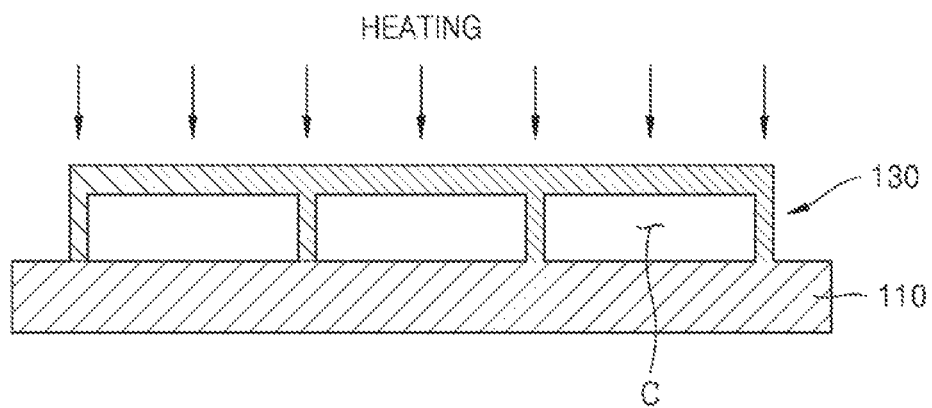

The membrane bridge 130 formed on the sacrificial layer 122 is generally amorphous or has a polycrystalline structure of fine grains. After the cavities C are formed by removing the sacrificial layer pattern 120, as illustrated in FIG. 2D, heat treatment may be performed on the membrane bridge 130. Accordingly, the amorphous or polycrystalline membrane bridge 130 may be crystallized.

The heat treatment for removing the sacrificial layer pattern 120 and the heat treatment on the membrane bridge 130 may be performed by gradually increasing the temperature or by a continuous process. In the case where the membrane bridge 130 is formed of the same material as the substrate 110 as in the case where the substrate 110 is a sapphire substrate and the membrane bridge 130 is alumina, when heated to, for example, about 1000° C., the membrane bridge 130 may be transformed into a structure having the same crystallographic direction as that of the substrate 110, and thus may become the crystallized membrane bridge 130.

Accordingly, an interface (indicated by dashed lines in the drawings) between the crystallized membrane bridge 130 and the substrate 110 may disappear. This is because, during the high-temperature heat treatment, the substrate 110 is in direct contact with the membrane bridge 130, and solid-phase epitaxial growth occurs at the membrane bridge 130, and thus the crystallization occurs in the crystallographic direction of the substrate 110. The solid-phase epitaxy starts from the interface between the substrate 110 and the membrane bridge 130, and, in the case where the membrane bridge 130 is amorphous, the finally crystallized membrane bridge 130 may become polycrystalline, or fine polycrystals may become larger in size or may be preferably changed into a single crystal like the substrate 110.

Such crystallization may occur over at least a part, in particular the entirety, of the membrane bridge 130. Because portions of the crystallized membrane bridge 130 on the cavities C subsequently act as seed portions when the epitaxial layer of the nitride semiconductor is grown, the portions of the membrane bridge 130 on the cavities C need to be crystallized. The upper surface of the membrane bridge 130 may be a substrate of the nitride semiconductor layer 150.

Figure 2E:
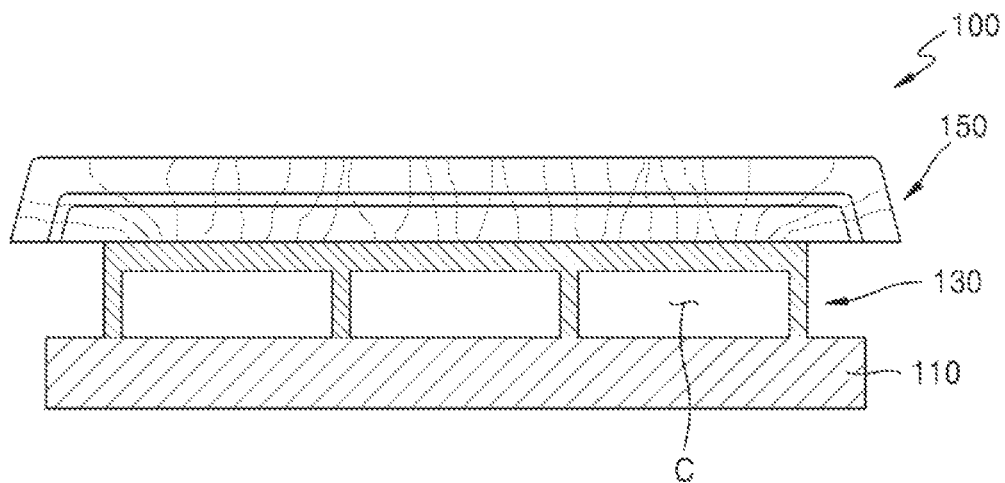

Next, as illustrated in FIG. 2E, the nitride semiconductor layer 150 may be further formed on the crystallized membrane bridge 130. A width of the nitride semiconductor layer 150 may be determined based on the size of the membrane bridge 130. For example, the width of the nitride semiconductor layer 150 may be greater than the width of the membrane bridge 130. In addition, because the size of the membrane bridge 130 is determined depending on the number of sacrificial layers 122, the width of the nitride semiconductor layer 150 may be estimated from the number of sacrificial layers 122 in the membrane bridge 130.

The nitride semiconductor layer 150 may be formed in a multi-layer structure. The nitride semiconductor layer 150 may include the first semiconductor layer 151, the active layer 152, and the second semiconductor layer 153 (see, e.g., FIG. 1). The nitride semiconductor layer 150 may include a nitride semiconductor material such as GaN, InN, AlN, or $Ga_xAl_yIn_zN$ (0<x, y, z<1), which is a combination thereof. A band gap may be adjusted according to a material type of the nitride semiconductor layer 150 to emit light in the ultraviolet, visible, and infrared ranges. In this case, for the nitride semiconductor layer 150, a seed may not grow from the substrate 110, but may grow from the crystallized membrane bridge 130. By adjusting the deposition temperature, the pressure and flow rate of gas, or the like, the nitride semiconductor layer 150 may be grown on the crystallized membrane bridge 130.

In the case where the nitride semiconductor layer 150 is grown on the membrane bridge 130 as described above to manufacture a light-emitting diode, the following advantages may be obtained. First, as the membrane bridge 130 serves as a compliant substrate, the nitride semiconductor layer 150 is grown while stress is relieved, and thus, the nitride semiconductor layer 150 having various properties may be grown. Second, because the growing nitride semiconductor layer 150 naturally grows into a core-shell structure to cover both ends of the semiconductor layer, a single nitride semiconductor layer that may be independently used may be grown on a single membrane bridge 130 without an etching process. Therefore, it is not necessary to etch both ends of the semiconductor layer, and it is possible to prevent a reduction in the current injection efficiency due to etching damage. Third, although defects in the membrane bridge 130 and the nitride semiconductor layer 150 are inevitably caused by a lattice difference, because the nitride semiconductor layer 150 is laterally grown on the membrane bridge 130, the defect density may be reduced.

When the nitride semiconductor layer 150 is grown on one membrane bridge 130 rather than on a plurality of patterns, line defects may be also reduced.

Figure 3A:
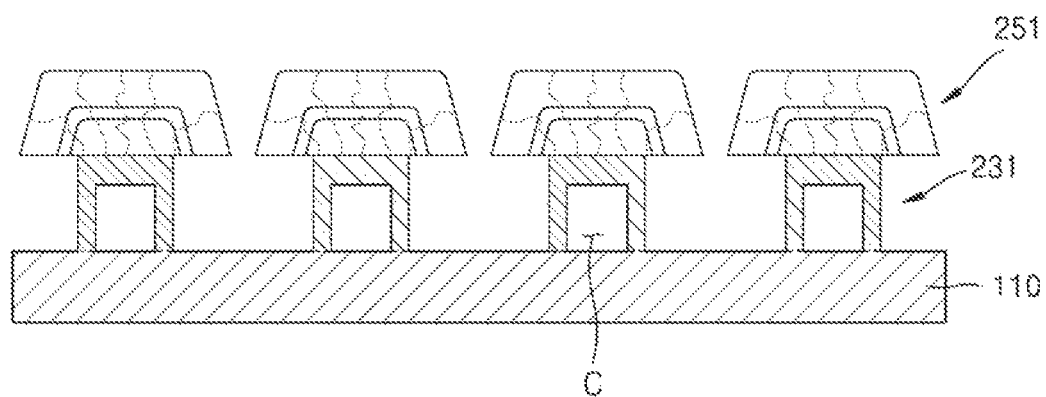
FIG. 3A and FIG. 3B are diagrams schematically illustrating defects of a nitride semiconductor layer grown on a plurality of membranes.
Figure 3B:
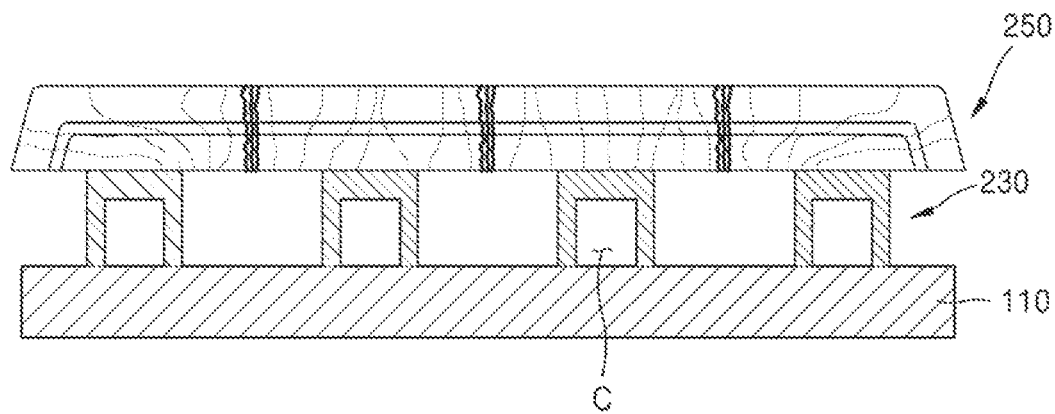

FIG. 3A and FIG. 3B are diagrams schematically illustrating defects of the nitride semiconductor layer 150 grown on a plurality of membranes.

As illustrated in FIG. 3A, a nitride semiconductor layer 251 is grown on each of a plurality of membranes 231. While each portion of the nitride semiconductor layers 251 is laterally grown, as shown in FIG. 3B, the portions are merged into one nitride semiconductor layer 250. There is a possibility that more defects may be generated at the boundaries where the growing portions of the nitride semiconductor layer 251 are merged.

As illustrated in FIG. 3B, the defects at the boundaries where the laterally growing portions are merged are clearly oriented and occur at the entire interfaces unlike the defects that occur on the membrane 231, and thus may be referred to as line defects. Even in the case where the nitride semiconductor layer 250 has a low overall defect density, the line defects are likely to cause a reduction in the internal quantum efficiency or leakage in current injection.

However, because the nitride semiconductor layer 150 according to an embodiment is grown on a single membrane bridge 130, line defects do not occur. Therefore, the nitride semiconductor layer 150 according to an embodiment may prevent current leakage due to a line defect.

In addition, the nitride semiconductor layer 250 as shown in FIG. 3B may be grown not only on the upper surfaces of the membranes on the cavities C, but also on lateral surfaces of the membranes on lateral surfaces of the cavities C or on regions of the membranes on the substrate 110. A nitride semiconductor layer grown from the lateral surfaces of the membranes on the lateral surfaces of the cavities C or from the regions of the membranes on the substrate 110 may be referred to as a parasitic nitride semiconductor layer. The parasitic nitride semiconductor layer may be in contact with the nitride semiconductor layer 250, and may require an additional process to be removed from the nitride semiconductor layer 250, or may degrade the performance of the nitride semiconductor layer 250.

Because the nitride semiconductor layer 150 according to an embodiment grows on a single membrane bridge 130, the growth of a parasitic nitride semiconductor layer may be prevented.

In addition, one nitride semiconductor layer 150 may be formed on one membrane. As the width of the nitride semiconductor layer 150 is determined based on the width of the membrane, in the case where the size of the nitride semiconductor layer 150 is in micro units, it is preferable that the width of the membrane is also in micro units. In the case where the membrane is formed on the sacrificial layers 122 and then the sacrificial layers 122 are removed, the membrane may sag because the thickness of the membrane is low, and the width of the membrane is large. In this case, the nitride semiconductor layer 150 may not be formed on the same crystal plane.

The membrane bridge 130 according to an embodiment may include three or more second regions 132 that are in contact with the substrate 110, and the upper surfaces of the first regions 131 and the second regions 132 may constitute a flat surface having the same height H with respect to the substrate 110. Thus, the entirety of the upper surface of the membrane bridge 130 has the same crystal plane. Because the membrane bridge 130 according to an embodiment does not sag, the nitride semiconductor layer 150 may be formed on the same crystal plane of the membrane bridge 130.

The crystallized membrane bridge 130 according to an embodiment may distribute and relieve stress with the nitride semiconductor layer 150 being grown thereon and thus serve as a compliant layer, and the nitride semiconductor layer 150 may be grown while the stress that may cause dislocation is relieved and thus achieve high quality with a low defect density.

Because of the presence of the cavities C, in the case where there is a difference in thermal expansion coefficient between the substrate 110 and the nitride semiconductor layer 150 formed thereon, the cavities C may be locally deformed, for example, stretched or compressed in a direction, thereby eliminating stress energy. Accordingly, thermal stress applied to the nitride semiconductor layer 150 may be reduced, and thus, warpage of the substrate 110 may be suppressed.

In particular, because the cavities C may be controlled by adjusting the shape, size, two-dimensional arrangement, or the like of the sacrificial layer pattern 120, the optical properties, for example, the emission pattern, of an LED manufactured from the semiconductor structure 100 may be adjusted. In addition, because the sacrificial layer pattern 120 is formed by a controlled method such as etching or nanoimprinting, the cavities C are also formed by a controlled method rather than being formed irregularly or randomly, and thus, reproducibility and device uniformity are excellent.

Meanwhile, when the nitride semiconductor layer 150 is grown on the substrate 110, the nitride semiconductor layer 150 and the substrate 110 are joined to each other at the atomic level, and accordingly, a special process such as laser lift-off is required to separate the nitride semiconductor layer 150 from the substrate 110. In an embodiment, because the membrane bridge 130 is between the substrate 110 and the nitride semiconductor layer 150, the membrane bridge 130 and the nitride semiconductor layer 150 may be easily separated from each other by collapsing the membrane bridge 130 with a small mechanical force without performing laser lift-off. Because the nitride semiconductor layer 150 may be separated by a small mechanical force such as a tensile force or a compressive force, the nitride semiconductor layer 150 may be separated from the substrate 110 without warpage, cracking, or chipping.

Accordingly, it is advantageous in the field of applications where the separation of the substrate 110 and the nitride semiconductor layer 150 is necessary, for example, the manufacture of a vertical LED, a horizontal LED, or a LED transferred to a certain substrate, and the substrate 110 may be reused.

Figure 4:
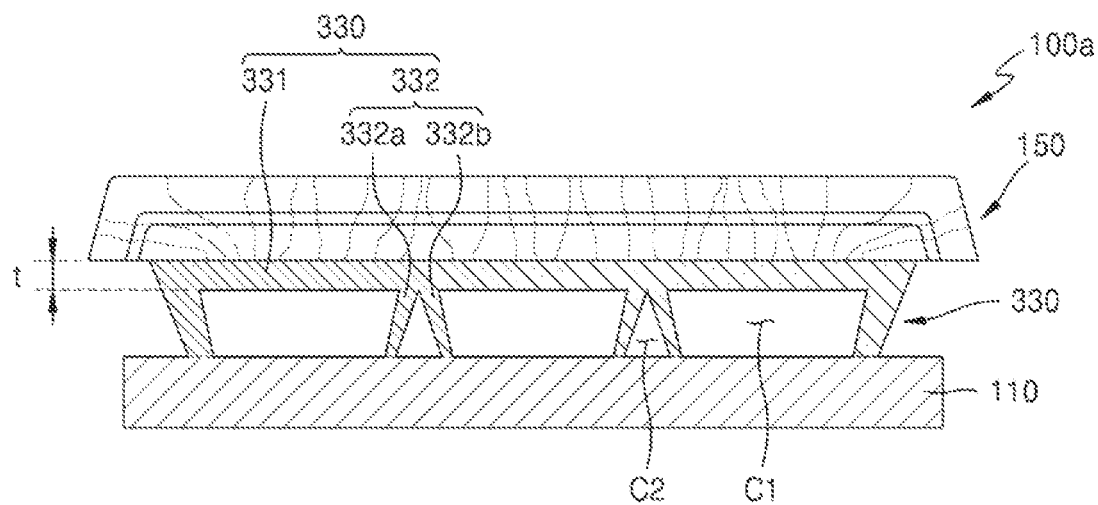
FIG. 4 is a diagram illustrating a semiconductor structure according to an embodiment.

FIG. 4 is a diagram illustrating a semiconductor structure 100a according to an embodiment. Comparing FIG. 1 with FIG. 4, the semiconductor structure 100a of FIG. 4 may include first cavities C1 having a width that narrows toward the substrate 110. The first cavity C1 may be formed by using a sacrificial layer having a width that narrows toward the substrate 110.

A membrane bridge 330 may include first regions 331 having lower surfaces defining the first cavities C1, respectively, and second regions 332 having lower surfaces in contact with the substrate 110. Upper surfaces of the first regions 331 and the second regions 332 may have a preset height with respect to a surface of the substrate 110. Accordingly, an upper surface of the membrane bridge 330 may have the same height H across its entirety.

The second region 332 may include first and second sub-regions 332a and 332b having lower regions (e.g., lower ends) spaced apart from each other and upper regions (e.g., upper ends) in contact with each other. A second cavity C2 may be formed between the first and second sub-regions 332a and 332b. The second cavity C2 may be formed when the membrane bridge 330 is formed. A size of the second cavity C2 may be less than the size of the first cavity C1. By forming the membrane bridge 330 by using a reverse sacrificial layer, the membrane bridge 330 having a smaller thickness t may be formed.

The semiconductor structure 100a of FIG. 4 may be manufactured by the same method as the method of manufacturing the semiconductor structure 100 of FIG. 1. However, their sacrificial layer patterns have different structures, and the semiconductor structure 100a of FIG. 4 may further include the second cavities C2.

FIGS. 5A to 5D are diagrams illustrating a method of manufacturing a light-emitting diode by using the semiconductor structure 100, according to an embodiment.

Figure 5A:
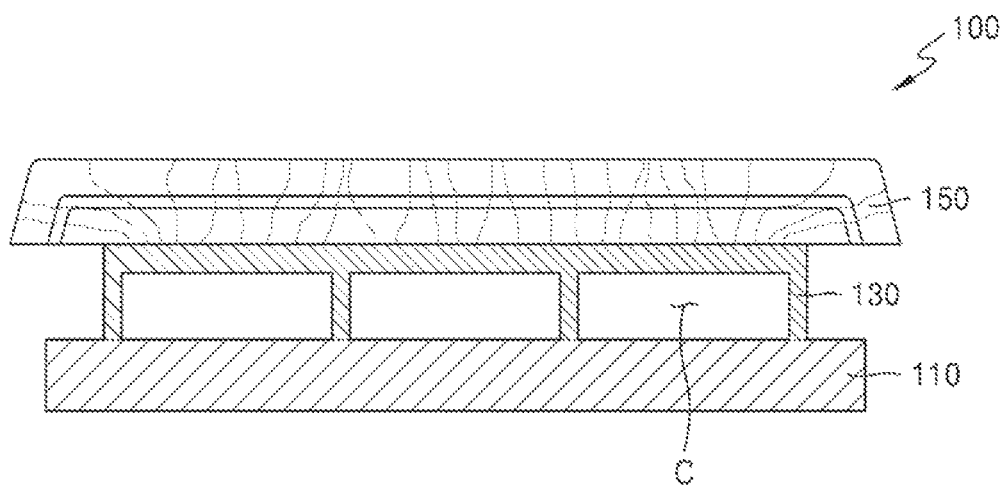
FIGS. 5A to 5D are diagrams illustrating a method of manufacturing a light-emitting diode by using a semiconductor structure, according to an embodiment.

As illustrated in FIG. 5A, the semiconductor structure 100, in which the membrane bridge 130 and the nitride semiconductor layer 150 are sequentially formed on the substrate 110, may be prepared. Because the method of manufacturing the semiconductor structure 100 has been described above, a detailed description thereof will be omitted.

Figure 5B:
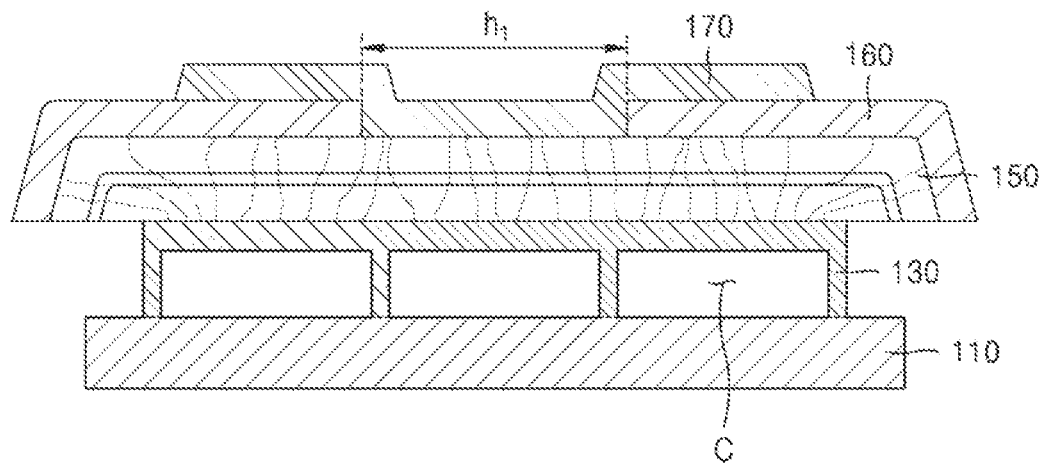

As illustrated in FIG. 5B, an insulating layer 160 and a first electrode 170 may be formed on the nitride semiconductor layer 150. The insulating layer 160 may surround at least a part of an upper region and a lateral region of the nitride semiconductor layer 150. The insulating layer 160 may include a hole h1 that exposes a partial portion of the nitride semiconductor layer 150. The insulating layer 160 may include at least one of oxide or nitride, such as silica ($SiO_2$), alumina ($Al_2O_3$), titania ($TiO_2$), zirconia ($ZrO_2$), yttria ($Y_2O_3$)-zirconia, copper oxide (CuO, $Cu_2O$), tantalum oxide ($Ta_2O_5$), aluminum nitride (AlN), or silicon nitride ($Si_3N_4$).

The second semiconductor layer 153 of the nitride semiconductor layer 150, exposed by the hole h1, may be an n-type or p-type semiconductor layer. The first electrode 170 may be arranged on the insulating layer 160. The first electrode 170 may be in electrical contact with the nitride semiconductor layer 150 through the hole h1 of the insulating layer 160. The first electrode 170 may include Al, Au, Pt, Mo, Cu, Ag, and/or Zn. The insulating layer 160 may be omitted according to the structure of the light-emitting diode.

Figure 5C:
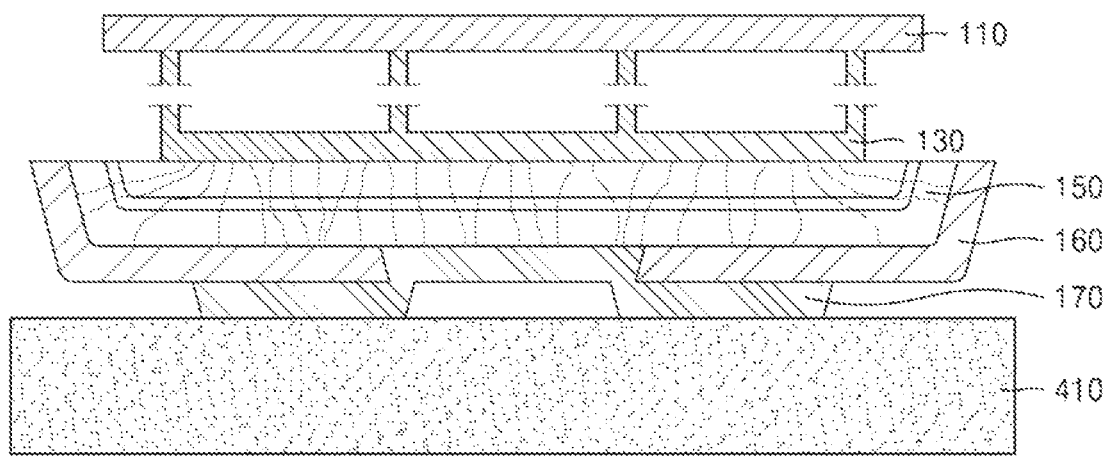

As illustrated in FIG. 5C, the nitride semiconductor layer 150, on which the first electrode 170 is formed, may be transferred to another substrate 410 (hereinafter, referred to as the "transfer substrate" 410). For example, the first electrode 170 may be bonded to the transfer substrate 410, and then the nitride semiconductor layer 150 and the substrate 110 may be separated from each other by applying a mechanical force. For example, the substrate 110 and the nitride semiconductor layer 150 may be separated from each other by collapsing the second regions 132 of the membrane bridge 130 by applying a tensile force, a compressive force, a rotating force, or the like to the membrane bridge 130.

Figure 5D:
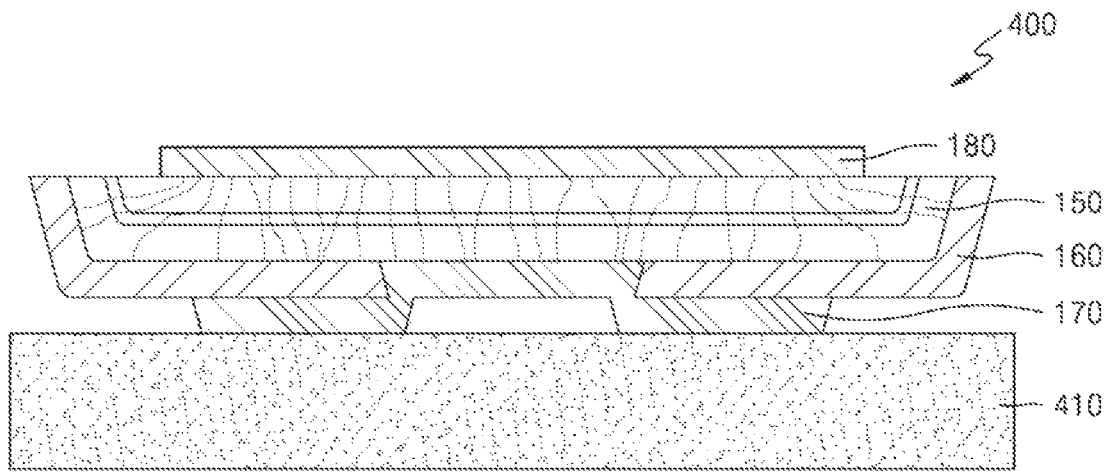

After removing the remaining membrane bridge 130, as illustrated in FIG. 5D, a second electrode 180 may be formed on the nitride semiconductor layer 150. As a result, the light-emitting diode may be manufactured. The second electrode 180 may include a conductive material, and may be the same material as the first electrode 170 or may include a different material therefrom. One light-emitting diode 400 may be manufactured from a single semiconductor structure 100 without performing an etching process, and thus, performance deterioration due to the etching process may be improved.

Figure 6A:
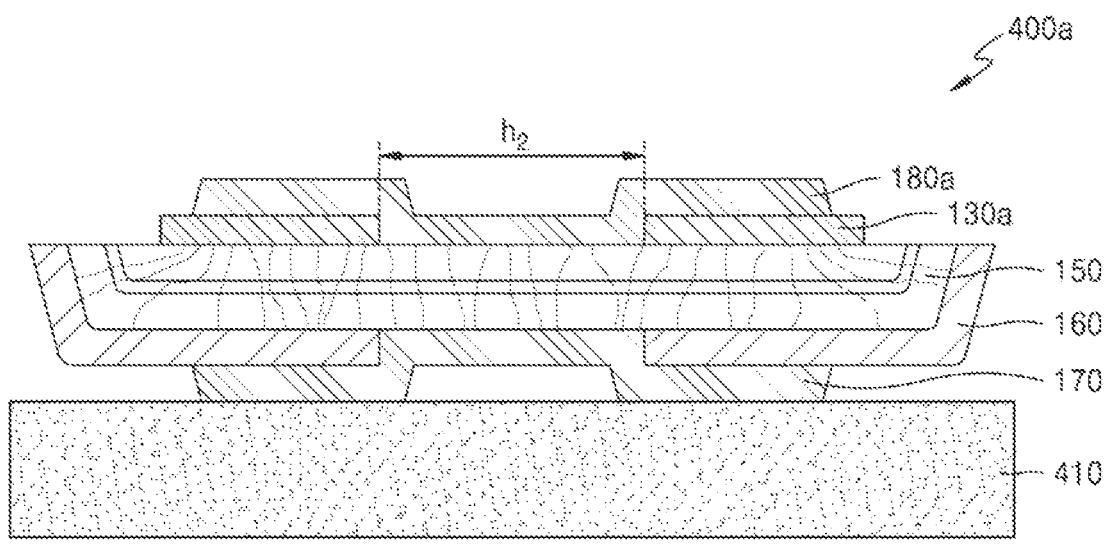
FIG. 6A is a diagram illustrating a light-emitting diode according to an embodiment.

FIG. 6A is a diagram illustrating a light-emitting diode 400a according to an embodiment. As illustrated in FIG. 6A, in the light-emitting diode 400a, only a part of the membrane bridge 130 is removed, and a partial membrane bridge 130a remains on the nitride semiconductor layer 150. For example, a hole h2 may be formed in the partial membrane bridge 130a to expose the nitride semiconductor layer 150. Then, a second electrode 180a may be formed to be in electrical contact with the nitride semiconductor layer 150. Because the partial membrane bridge 130a is also an insulating material, the partial membrane bridge 130a may prevent leakage current from the nitride semiconductor layer 150.

Figure 6B:
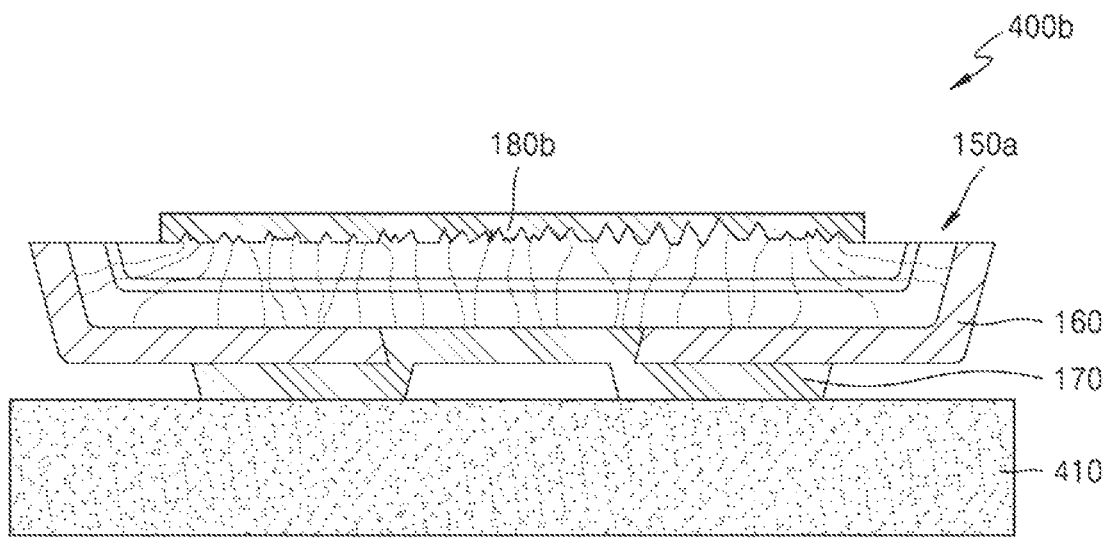
FIG. 6B is a diagram illustrating a light-emitting diode according to an embodiment.

FIG. 6B is a diagram illustrating a light-emitting diode 400b according to an embodiment. As illustrated in FIG. 6B, a first semiconductor layer of a nitride semiconductor layer 150a may include an uneven structure. A second electrode 180b may be arranged on the uneven structure. The uneven structure may increase a light emission area and increase a critical angle of light emission, thereby improving the light emission efficiency of the light-emitting diode. Although FIG. 6B illustrates that the surface of the first semiconductor layer of the nitride semiconductor layer 150a has an uneven structure, the disclosure is not limited thereto. A surface of the second semiconductor layer of the nitride semiconductor layer 150 may also have an uneven structure.

Figure 7:
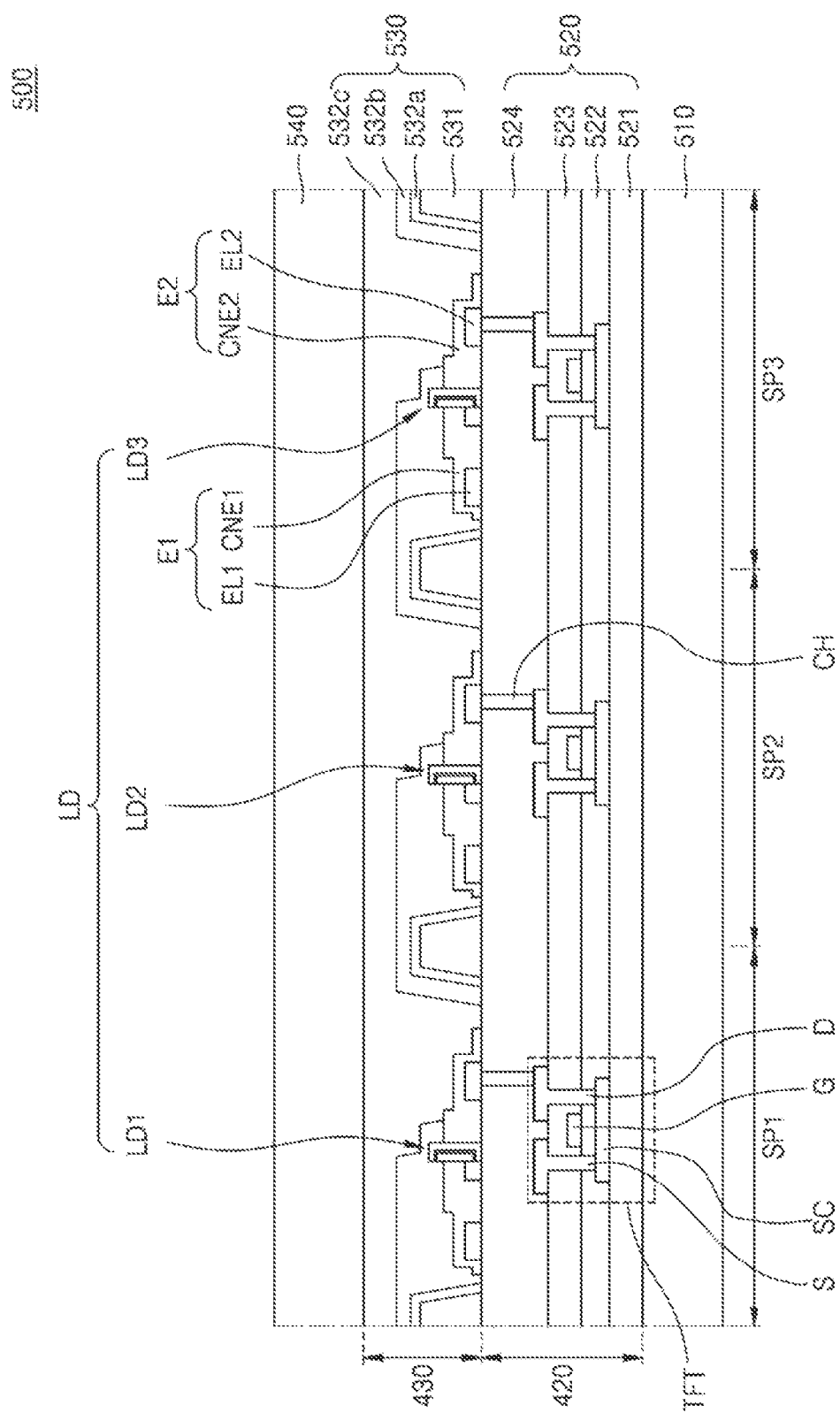
FIG. 7 is a diagram illustrating a display device including a nitride semiconductor layer according to an embodiment.

FIG. 7 is a diagram illustrating a part of a display device including a nitride semiconductor layer according to an embodiment. Referring to FIG. 7, a display device 500 may include a substrate 510 on which a plurality of pixels are provided. One pixel may include a first sub-pixel SP1, a second sub-pixel SP2, and a third sub-pixel SP3 provided on the substrate 510.

The first to third sub-pixels SP1, SP2, and SP3 may be sub-pixel regions that display an image in one pixel and may be light emission regions from which light is emitted.

Each of the first to third sub-pixels SP1, SP2, and SP3 may include the substrate 510, a driving element layer 520, a display element layer 530, and a cover structure layer 540.

The substrate 510 may include an insulating material such as glass, an organic polymer, quartz, or the like. In addition, the substrate 510 may be formed of a flexible material so as to be bendable or foldable, and may have a single-layer structure or a multi-layer structure.

The driving element layer 520 may include a buffer layer 521 arranged on the substrate 510, a thin film transistor (TFT) arranged on the buffer layer 521, and a driving voltage wiring.

The buffer layer 521 may prevent impurities from diffusing into the transistor TFT. The buffer layer 521 may be provided as a single layer, or may be provided as at least two layers.

In the case where the buffer layer 521 is provided as multiple layers, the layers may be formed of the same material or different materials. The buffer layer 521 may be omitted according to the material and process conditions of the substrate 510.

The transistor TFT may drive a corresponding light-emitting diode LD among a plurality of light-emitting diodes LD1, LD2, and LD3 included in the display element layer 530. The transistor TFT may include a semiconductor layer SC, a gate electrode G, a source electrode S, and a drain electrode D.

The semiconductor layer SC may be arranged on the buffer layer 521. The semiconductor layer SC may include a source region in contact with the source electrode S and a drain region in contact with the drain electrode D. A region between the source region and the drain region may be a channel region.

The semiconductor layer SC may be a semiconductor pattern formed of polysilicon, amorphous silicon, an oxide semiconductor, or the like. The channel region may be a semiconductor pattern that is not doped with impurities, and may be an intrinsic semiconductor. The source region and the drain region may be semiconductor patterns doped with impurities.

The gate electrode G may be provided on the semiconductor layer SC with a gate insulating layer 522 therebetween.

The source electrode S and the drain electrode D may be in contact with the source region and the drain region of the semiconductor layer SC, respectively, through a contact hole penetrating an interlayer insulating layer 523 and the gate insulating layer 522.

A protective layer 524 may be provided on the transistor TFT.

The display element layer 530 may include the plurality of light-emitting diodes LD1, LD2, and LD3 provided on the protective layer 524. For example, the light-emitting diode LD1 of the first sub-pixel SP1 may emit red light, the light-emitting diode LD2 of the second sub-pixel SP2 may emit green light, and the light-emitting diode LD3 of the third sub-pixel SP3 may emit blue light. The wavelength of emitted light may be changed by adjusting the In content in a process of manufacturing the light-emitting diodes LD1, LD2, and LD3.

In FIG. 7, the nitride semiconductor layer 150 illustrated in FIG. 1 is illustrated as each of the light-emitting diodes LD1, LD2, and LD3. Alternatively, any one of the light-emitting diodes LD1, LD2, and LD3 of the first to third sub-pixels SP1, SP2, and SP3, respectively, may have any one of the semiconductor structures 100, 100a.

The display element layer 530 may further include pixel defining layers 531. The pixel defining layers 531 may be provided on the protective layer 524, and may define the light emission regions in the first to third sub-pixels SP1, SP2, and SP3, respectively. The pixel defining layers 531 may include openings exposing the light-emitting diodes LD1, LD2, and LD3 included the first to third sub-pixels SP1, SP2, and SP3, respectively.

Two adjacent pixel defining layers 531 may be spaced apart from each other by a preset gap on the substrate 510. For example, two adjacent pixel defining layers 531 may be spaced apart from each other on the substrate 510 by a gap greater than or equal to the length of the light-emitting diodes LD1, LD2, and LD3. The pixel defining layer 531 may be, but is not limited to, an insulating material including an inorganic material or an organic material.

The pixel defining layer 531 may be an insulating material including an organic material. For example, the pixel defining layer 531 may include polystyrene, polymethylmethacrylate (PMMA), polyacrylonitrile (PAN), polyamide (PA), polyimide (PI), polyarylether (PAE), a heterocyclic polymer, parylene, epoxy, benzocyclobutene (BCB), a siloxane-based resin, a silane-based resin, or the like.

First insulating layers 532a may be provided on the pixel defining layers 531. Each of the first insulating layers 532a may cover a part of an upper surface of each of the light-emitting diodes LD1, LD2, and LD3 provided in the first to third sub-pixels SP1, SP2, and SP3, respectively. A first end and a second end of each of the light-emitting diodes LD1, LD2, and LD3 may be exposed to the outside by the first insulating layer 532a.

First and second electrodes E1 and E2 may be arranged on the protective layer 524. The first electrode E1 may include a first sub-electrode EL1 arranged adjacent to one end (e.g., the first semiconductor layer) of the corresponding light-emitting diode LD, and a first contact electrode CNE1 that electrically connects the first sub-electrode EL1 to the one end of the light-emitting diode LD. The second electrode E2 may include a second sub-electrode EL2 arranged adjacent to the other end (e.g., the second semiconductor layer) of the corresponding light-emitting diode LD, and a second contact electrode CNE2 that electrically connects the second sub-electrode EL2 to the other end of the light-emitting diode LD.

Accordingly, a driving voltage may be applied to the corresponding light-emitting diode LD through the first electrode E1, and a voltage of the transistor TFT may be applied to the corresponding light-emitting diode LD through the second electrode E2. As a result, as certain voltages are applied to both ends of the light-emitting diode LD through the first electrode E1 and the second electrode E2, the light-emitting diode LD may emit light. The wavelength of emitted light may vary depending on the content of In of the light-emitting diode.

A second insulating layer 532b and a third insulating layer 532c may be provided on the first and second electrodes E1 and E2.

An overcoat layer 540 may be provided on the third insulating layer 532c. The overcoat layer 540 may be a planarization layer that mitigates undulations formed by the elements arranged below the overcoat layer 540. In addition, the overcoat layer 540 may be an encapsulation layer that prevents oxygen, moisture, or the like from penetrating into the light-emitting diodes.

In the case where the light-emitting diodes LD1, LD2, and LD3 of the sub-pixels SP1, SP2, and SP3 emit light of the same wavelength, the display device may further include a color conversion layer. The color conversion layer may include first to third color conversion patterns. Here, each of the first to third color conversion patterns may correspond to one sub-pixel. For example, the first color conversion pattern may correspond to the first sub-pixel SP1, the second color conversion pattern may correspond to the second sub-pixel SP2, and the third color conversion pattern may correspond to the third sub-pixel SP3.

Figure 8:
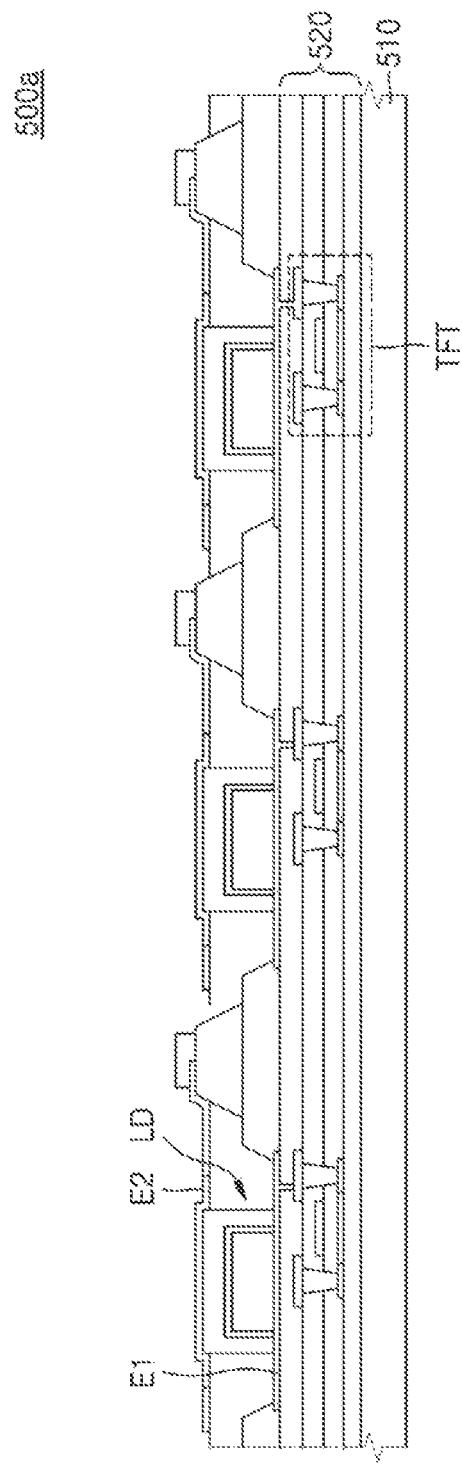
FIG. 8 is a diagram illustrating a display device according to an embodiment.

FIG. 8 is a diagram illustrating a part of a display device according to an embodiment. Comparing FIG. 7 with FIG. 8, a first semiconductor layer, an active layer, and a second semiconductor layer of a light-emitting diode LD illustrated in FIG. 8 may be arranged in parallel to the thickness direction of the substrate 510.

The display device including the light-emitting diodes described above may be employed in various electronic devices. For example, the display device may be applied to a television, a notebook, a mobile phone, a smartphone, a smart pad, a portable multimedia player (PMP), a personal digital assistant (PDA), a navigation system, various wearable devices such as a smart watch, or the like.

It has been described that the nitride semiconductor layers 150 and 150a included in the semiconductor structure may be used as components of a light-emitting device or a display device. However, the disclosure is not limited thereto. The nitride semiconductor layers 150 and 150a included in the semiconductor structure 100 according to an embodiment may be also used as light detection elements.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:

1. A method of manufacturing a semiconductor structure, the method comprising:
   forming, on a substrate, a sacrificial layer pattern comprising a plurality of sacrificial layers spaced apart from each other;
   forming, on the sacrificial layer pattern, a membrane bridge that covers the plurality of sacrificial layers and comprises an upper surface with a constant height with respect to a surface of the substrate, the upper surface being at the constant height over an entire length of the sacrificial layer pattern comprising the plurality of sacrificial layers;
   removing the sacrificial layer pattern from the substrate to form a plurality of cavities defined by the substrate and the membrane bridge;
   crystallizing the membrane bridge such that the membrane bridge and the substrate have a same crystallographic direction; and
   growing a nitride semiconductor layer on the crystallized membrane bridge wherein the membrane bridge comprises alumina (A2O3).

2. The method of claim 1, wherein a gap between adjacent sacrificial layers of the plurality of sacrificial layers is less than a width of each of the plurality of sacrificial layers.

3. The method of claim 1, wherein a gap between adjacent sacrificial layers of the plurality of sacrificial layers is less than or equal to half of a width of each of the plurality of sacrificial layers.

4. The method of claim 1, wherein a gap between adjacent sacrificial layers of the plurality of sacrificial layers is about 500 nm or less.

5. The method of claim 1, wherein the plurality of cavities are in contact with the substrate.

6. The method of claim 1, wherein the membrane bridge comprises:
   a plurality of first regions wherein each of the plurality of first regions overlaps a respective sacrificial layer of the plurality of sacrificial layers in a thickness direction of the substrate; and
   a plurality of second regions that do not overlap any of the plurality of sacrificial layers in the thickness direction of the substrate.

7. The method of claim 6, wherein each of the plurality of second regions fills a respective space between adjacent sacrificial layers of the plurality of sacrificial layers.

8. The method of claim 6, wherein a width of each of the plurality of second regions is less than a thickness of the plurality of first regions.

9. The method of claim 6, wherein a width of the plurality of first regions is about 1 μm or less.

10. The method of claim 6, wherein each of the plurality of second regions comprises a first sub-region and a second sub-region,
    wherein a first end of the first sub-region is spaced apart from a first end of the second sub-region,
    wherein the first end of the first sub-region and the first end of the second sub-region are in contact with the substrate, and
    wherein a second end of the first sub-region is in contact with a second end of the second sub-region.

11. The method of claim 10, wherein for each second region of the plurality of second regions, a second cavity is formed between the first sub-region and the second sub-region.

12. The method of claim 11, wherein for each first region of the plurality of first regions, a width of a corresponding cavity of the plurality of cavities decreases from the first region toward the substrate.

13. The method of claim 11, wherein a size of each of the plurality of second cavities is less than a size of each of the plurality of cavities.

* * * * *